United States Patent
Negra et al.

(10) Patent No.: US 9,787,255 B2
(45) Date of Patent: Oct. 10, 2017

(54) SEQUENTIAL BROADBAND DOHERTY POWER AMPLIFIER WITH ADJUSTABLE OUTPUT POWER BACK-OFF

(71) Applicant: RWTH AACHEN, Aachen (DE)

(72) Inventors: Renato Negra, Aachen (DE); Xuan Anh Nghiem, Aachen (DE)

(73) Assignee: RWTH AACHEN (DE)

( * ) Notice: Subject to any disclaimer, the term of this patent is extended or adjusted under 35 U.S.C. 154(b) by 0 days.

(21) Appl. No.: 15/027,037

(22) PCT Filed: Oct. 1, 2014

(86) PCT No.: PCT/EP2014/071015
§ 371 (c)(1),
(2) Date: Apr. 4, 2016

(87) PCT Pub. No.: WO2015/049272
PCT Pub. Date: Apr. 9, 2015

(65) Prior Publication Data
US 2016/0268976 A1    Sep. 15, 2016

(30) Foreign Application Priority Data

Oct. 5, 2013 (DE) ................. 10 2013 220 160

(51) Int. Cl.
*H03F 1/32* (2006.01)
*H03F 3/193* (2006.01)
(Continued)

(52) U.S. Cl.
CPC ......... *H03F 1/3205* (2013.01); *H03F 1/0211* (2013.01); *H03F 1/0288* (2013.01);
(Continued)

(58) Field of Classification Search
USPC ................. 330/124 R, 295, 84, 286, 53–54
See application file for complete search history.

(56) References Cited

U.S. PATENT DOCUMENTS 8,274,332 B2 * 9/2012 Cho ...................... H03F 1/0261
330/124 R

* cited by examiner

*Primary Examiner* — Hieu Nguyen
(74) *Attorney, Agent, or Firm* — Sheridan Ross P.C.

(57) ABSTRACT

The invention relates to a sequential broadband Doherty power amplifier with adjustable output power back-off The sequential broadband Doherty power amplifier has at least one input ($I_1$, $I_2$; $RF_{in}$) for receiving at least one broadband HF signal, wherein the broadband HF signal or broadband HF signals ($RF_{in}$) have at least an average power level (carrier/average) and a peak envelope power level (peak), with the average power level and the peak envelope power level defining a crest factor, and a first amplifier branch for amplifying the input signal, with the first amplifier branch providing the amplification substantially for the low and at least the average power level, at least one second amplifier branch for amplifying the input signal, wherein the second amplifier branch substantially provides the amplification for the peak envelope power level, wherein the output of the first amplifier branch is connected via an impedance inverter ($Z_T$) to the output of the second amplifier branch, the junction (CN) being connected to the load ($Z_0$) in a substantially directly impedance-matched manner, wherein the first and the second amplifier branch each have a supply voltage, with at least one of the supply voltages being variable as a function of the crest factor of the signal to be amplified, and wherein the signal propagation delay through the at least two amplifier branches is substantially identical in the operating range.

12 Claims, 4 Drawing Sheets

Figure 1:
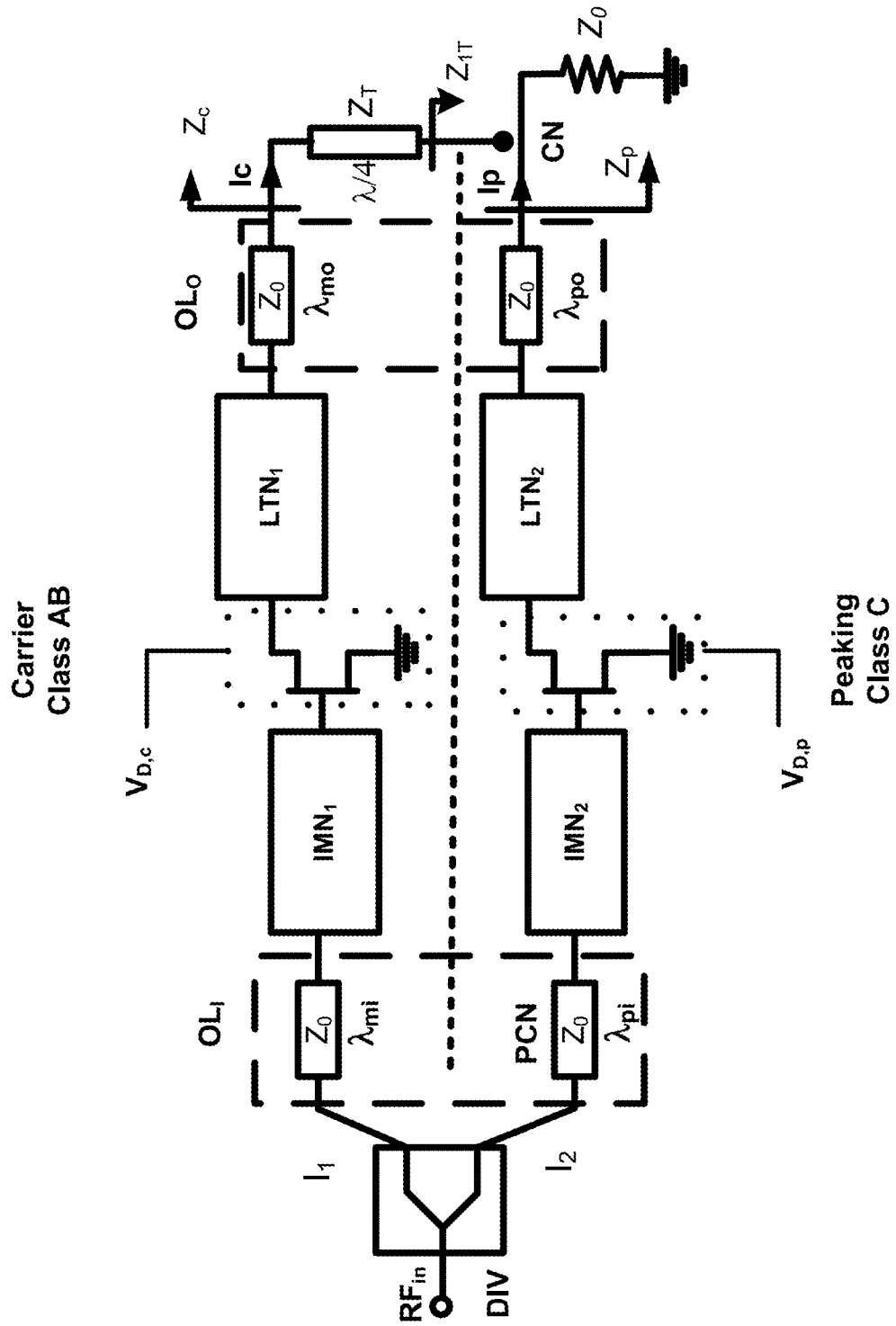

(51) Int. Cl.
 *H03F 3/21* (2006.01)
 *H03F 1/02* (2006.01)
 *H03F 3/24* (2006.01)
(52) U.S. Cl.
 CPC ............. *H03F 3/193* (2013.01); *H03F 3/211* (2013.01); *H03F 3/245* (2013.01); *H03F 2200/15* (2013.01); *H03F 2200/451* (2013.01); *H03F 2201/3203* (2013.01); *H03F 2201/3233* (2013.01); *H03F 2203/21103* (2013.01)

US 9,787,255 B2

SEQUENTIAL BROADBAND DOHERTY POWER AMPLIFIER WITH ADJUSTABLE OUTPUT POWER BACK-OFF

CROSS REFERENCE TO RELATED APPLICATIONS

This application is a national stage application under 35 U.S.C. 371 and claims the benefit of PCT Application No. PCT/EP2014/071015 having an international filing date of 01 Oct. 2014, which designated the United States, which PCT application claimed the benefit of German patent application Ser. No. 10 2013 220 160.5 filed 05Oct. 2013, the disclosures of each of which are incorporated herein by reference in their entirety.

The invention relates to a sequential broadband Doherty power amplifier with adjustable output power back-off.

BACKGROUND OF THE INVENTION

Modern wireless communication systems such as those based, for example, on W-CDMA, WiMax or LTE, have been developed with the aim of providing high data rates with efficient use of the spectrum.

This is generally achieved by a plurality of complex modulation types that are used for this purpose. It should be noted that these complex modulation types use signals with a high PAR (peak-to-average power ratio) of peak envelope power (PEP) to average power ($P_{avg}$) on the order of magnitude of about 6-12 dB.

In many areas of wireless communications technology, the linearity of the of the transmission characteristic is one of the core requirements. Particularly in digital transmission systems, this is eminently important.

Nonlinearities in transmitters promote undesired emissions that impair the connection quality of other subscribers or other transmission services.

In addition, distortions are brought about by the nonlinearities which have a negative impact on the quality of the user's own connection.

Previously, this problem was addressed by over-dimensioning the high-frequency output stages with respect to the average output power. For instance, output power reserves (back-off, BO) of 10 dB or more are not uncommon for ensuring the required linearity.

This over-dimensioning of the system has numerous drawbacks. For one, the manufacturing costs are higher. For another, the power output is low, that is, the efficiency of a transmitter rapidly decreases as the back-off increases. As the efficiency decreases, the power loss increases. In order to dissipate the resulting residual heat, commensurate cooling devices must be provided.

In base stations, for example, cooling units have to be installed whose constant operation degrades the power balance of the base station even further upon incorporation of the necessary cooling capacity. Typical values for the efficiency of modern base stations therefore often lie in the single-digit percent range.

Great efforts have been made in the past in order to deal with this problem.

Among other things, various approaches have been taken, such as envelope elimination and restorations (EER), outphasing or LINC (linear amplification using nonlinear components), as well as active load modulation.

However, these approaches are complex and cannot be readily integrated into existing systems as a replacement for other power amplifiers, requiring extensive adaptations instead.

Other approaches based on so-called Doherty power amplifiers, however, exhibit a back-off of only 6 dB when using so-called symmetrical Doherty power amplifiers and therefore cannot be used for systems with a higher back-off requirement.

This is only possible with so-called asymmetrical Doherty power amplifiers. However, it can generally only be achieved to the detriment of efficiency, amplification and/or bandwidth. For broadband asymmetrical Doherty power amplifiers, it can generally be assumed that they likewise provide an output power back-off on the order of magnitude of 6 dB.

While it is true that recent approaches exist for digital Doherty power amplifiers, they are still characterized by enormous complexity for the required independent control of amplitude and phase of two coherent signals.

It would therefore be desirable to provide an amplifier that can make a higher back-off available on broadband that can easily be varied and thus provides improved average efficiency for different modulation processes.

The object is achieved by a sequential broadband Doherty power amplifier with adjustable output power back-off according to claim 1. Additional advantageous embodiments particularly constitute the subject matter of the dependent claims.

The invention is explained in further detail below with reference to the figures.

Figure 2:
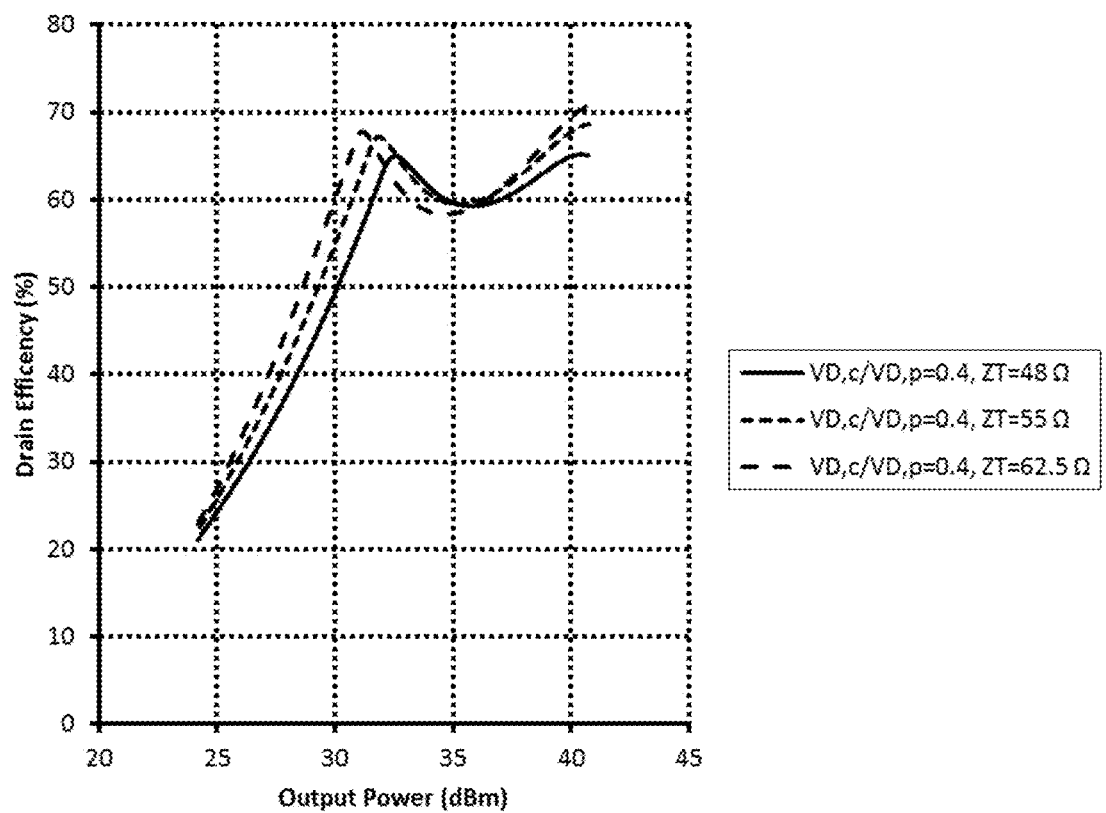
Figure 3:
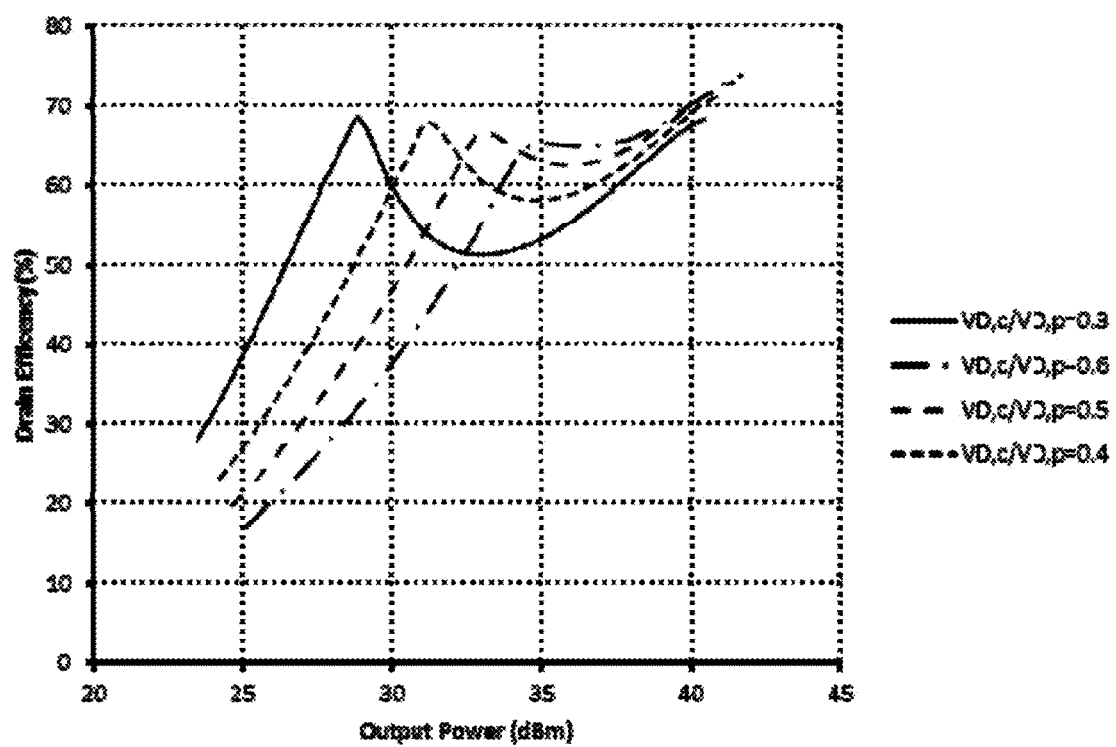
Figure 4:
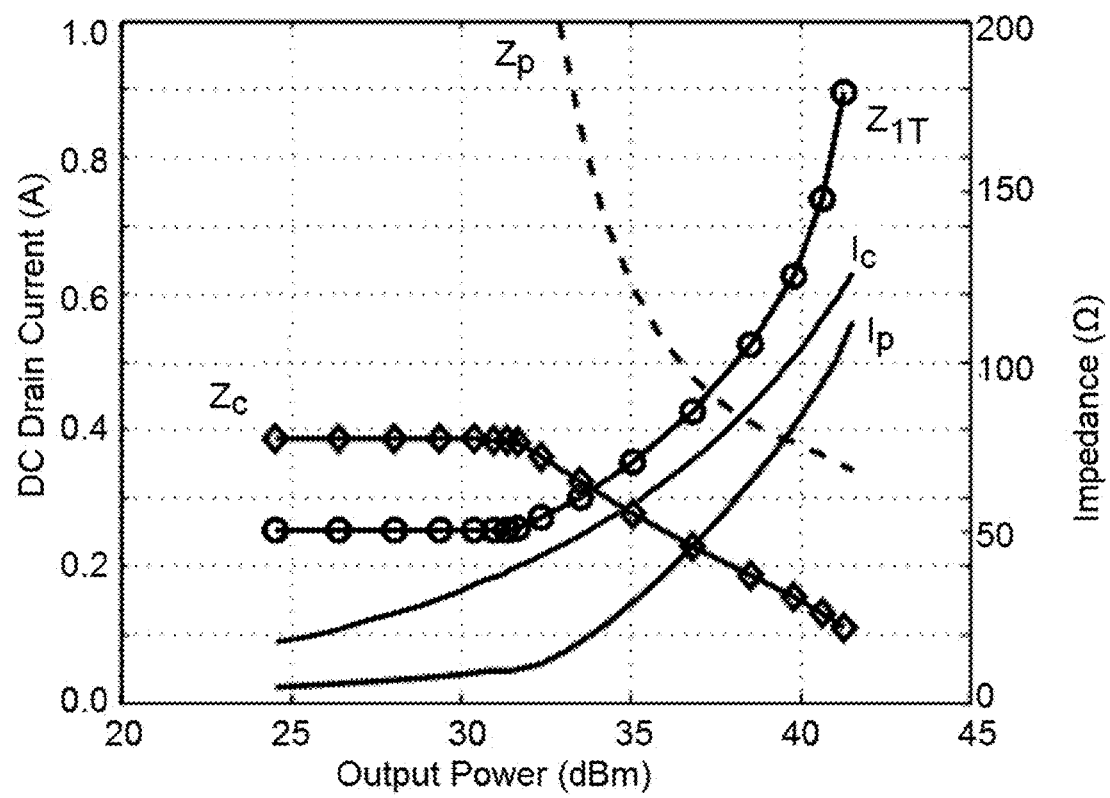

FIG. 1 shows a schematic block diagram prior to the inventive embodiments,

FIG. 2 shows an exemplary drain efficiency in percent over the output power in dBm for different values of an impedance inverter $Z_T$, FIG. 3 shows an exemplary drain efficiency in percent over the output power in dBm for different ratios of the supply voltage to the first and second amplifier branch $V_{D,c}/V_{D,p}$, and FIG. 4 shows an exemplary load modulation and the corresponding drain currents according to one embodiment of the invention.

FIG. 1 shows a schematic block diagram according to embodiments of the invention.

This sequential broadband Doherty power amplifier with adjustable output power back-off has at least one input for receiving at least one broadband HF signal.

In FIG. 1, for example, a broadband HF signal RF is made available at a first input $I_1$ and at a second input $I_2$.

The broadband HF signal or the broadband HF signal RF has at least an average power level ($P_{avg}$) and a peak envelope power level (PEP), with the average power level and the peak envelope power level defining a crest factor $C = PEP/P_{avg}$.

Optionally, a broadband HF signal $RF_{in}$ can be made available as shown in FIG. 1 by means of one (or several) power splitters DIV to the two inputs $I_1$ and $I_2$.

Moreover, the sequential Doherty power amplifier according to the invention has a first amplifier branch for amplifying the input signal, with the first amplifier branch substantially providing the amplification for the low and at least the average power level.

This amplifier branch is shown, for example, in the upper half of FIG. 1 (substantially above the dashed line) and can, for example, be embodied as a GaN-based (gallium nitride) amplifier in HEMT (High Electron Mobility Transistor), e.g., a 6-W GaN HEMT. This first amplifier branch can be a carrier class AB amplifier, for example.

Moreover, the sequential Doherty power amplifier according to the invention has at least one second amplifier branch for amplifying the input signal, with the second amplifier branch substantially providing the amplification for the peak envelope power level.

This amplifier branch is shown, for example, in the lower half of FIG. 1 (substantially below the dashed line) and can, for example, be embodied as a GaN-based (gallium nitride) amplifier in HEMT (High Electron Mobility Transistor), e.g., a 10-W GaN HEMT. This first amplifier branch can be a class C amplifier, for example.

In the embodiments according to the invention, the output of the first amplifier branch—designated by $Z_c$,—is connected via an impedance inverter $Z_T$ to the output of the second amplifier branch—designated by $Z_p$—at the junction CN.

Although the impedance inverter $Z_T$ is depicted as a concentrated element, other variants, particularly an impedance inverter network, can also be provided depending on the requirements. The junction CN is connected to the load $Z_0$ in a substantially directly impedance-matched manner.

The first amplifier branch and the second amplifier branch each have a supply voltage, at least one of the supply voltages being variable as a function of the crest factor of the signal to be amplified, whereby the ratio of the two supply voltages can be varied.

Moreover, the sequential Doherty power amplifier according to the invention is embodied such that the signal propagation delay through the at least two amplifier branches is substantially identical in the operating range.

With such an arrangement, bandwidths of 500 MHz and more and an adjustable output power back-off of at least 6 dB to 12 dB and beyond can readily be produced.

In the presented sequential Doherty power amplifier according to the invention, the first amplifier branch (carrier) is substantially dimensioned such that it is saturated at a predefined output power back-off when it operates at optimal load. If the input power increases further, the second amplifier branch increasingly takes over the amplification of the signal. This transfer occurs through the active load modulation of the impedance at the output of the first amplifier. This impedance decreases continually as the input power increases, so that the effective contribution of the first amplifier branch to the overall power supplied to the load decreases. The contribution of the first amplifier branch (carrier) is then rather small at the maximum power of the overall arrangement, and the substantial portion of the output power is made available by the second amplifier branch or other amplifier branches.

As a result, a soft transition is made available between the first and the second and/or other amplifier branches within the active load modulation region.

In order to accomplish this, the first amplifier branch must be virtually separated from the second and/or other amplifier branches at the junction CN.

In other words, the impedance $Z_T$ must be high at saturation in relation to the junction CN from the perspective of the first amplifier branch. This makes it possible to combine both a broadband first amplifier branch and a broadband second amplifier branch and/or other amplifier branch, thus making available the desired output power back-off over a large bandwidth.

Due to a reduced impedance transformation ratio, the sequential Doherty power amplifier according to the invention does not require any impedance matching network on the output side toward the load $Z_0$. This substantially reduces the size of the circuit and avoids the negative influence on the available bandwidth as a result of either the primary characteristics of such an impedance matching network or of the parasitic effects.

In particular, through the use of a suitable power splitter DIV, it can be ensured that the first amplifier branch can be operated in saturation conditions. For this purpose, in one embodiment of the invention, the sequential Doherty power amplifier can be equipped with a 3 dB power splitter DIV, for example, so that both amplifier branches receive an HF signal RF of the same power at the respective inputs $I_1$ and $I_2$.

From the perspective of the junction CN, in the exemplary embodiment of FIG. 1, the result for the virtual impedance $Z_c$ (see FIG. 1) in relation to the first amplifier branch is $$Z_c = \begin{cases} \dfrac{Z_T^2}{Z_0} & @BO \\ \dfrac{Z_T^2}{\alpha Z_0} & @PEP, \end{cases}$$

where BO refers to the operating mode in output power back-off and PEP to the operating mode at peak envelope power (PEP), and $$\alpha = 1 + \frac{I_{p|sat}}{I_{c|sat}} \cdot \frac{V_{DD,p} - V_{k,p}}{V_{DD,c} - V_{k,c}}$$

can be derived from the currents $I_{p|sat}$, $I_{c|sat}$ of the respective amplifier branches in the case of saturation of the respective amplifier branch and the respective supply voltages $V_{DD,p}$, $V_{DD,c}$ of the amplifier branches and the knee voltages $V_{k,p}$, $V_{k,c}$ of the respective amplifier branches.

From the perspective of the junction CN, in the exemplary embodiment of FIG. 1, the result for the virtual impedance $Z_p$ (see FIG. 1) in relation to the second amplifier branch is $$Z_p = \begin{cases} \infty & @BO \\ \beta Z_0 & @PEP, \end{cases}$$

where BO refers to the operating mode in output power back-off and PEP to the operating mode at peak envelope power (PEP), and $$\beta = \frac{\alpha}{\alpha - 1}$$

in which $$\alpha = 1 + \frac{I_{p|sat}}{I_{c|sat}} \cdot \frac{V_{DD,p} - V_{k,p}}{V_{DD,c} - V_{k,c}}$$

can be derived from the currents $I_{p|sat}$, $I_{c|sat}$ of the respective amplifier branches in the case of saturation of the respective amplifier branch and the respective supply voltages $V_{DD,p}$, $V_{DD,c}$ of the amplifier branches and the knee voltages $V_{k,p}$, $V_{k,c}$ of the respective amplifier branches.

The characteristic of the impedance inverter $Z_T$ can also be derived from this:

$$Z_T = \sqrt{\frac{(V_{D,c} - V_{k,c})^2 \cdot Z_0^2}{10^{-\frac{BO}{10}} \cdot (V_{D,p} - V_{k,p})^2}},$$

where BO (in dB) is determined as the specific output power back-off with $$BO = -20\log_{10}\left(\frac{V_{DD,c} - V_{k,c}}{V_{DD,p} - V_{k,p}} \cdot \frac{Z_0}{Z_T}\right).$$

If yet more amplifier branches are provided in addition to the second amplifier branch (peak), one obtains a similar situation for each of the second and other amplifier branches in relation to the first amplifier branch (carrier).

Moreover, the sequential broadband Doherty power amplifier can have yet other components, such as, for example, offset lines on the input side $OL_i$ and/or on the output side $OL_O$ and, within the respective amplifier branches, an input matching network $INM_1$, $INM_2$ as well as a load transmission network $LTN_1$, $LTN_2$ to which tasks such as a necessary phase shift PCN—e.g., a λ/4 phase shift analogous to a λ/4 of an impedance inverter $Z_T$—can also be assigned, although these elements are not necessary for understanding the invention. These elements ensure, as necessary, that the signal propagation delays in the amplifier branches are nearly identical, thus preventing nonlinearities.

As already remarked previously, it is possible with the arrangement according to the invention to achieve Doherty amplification with load modulation using a single input signal $RF_{in}$.

The presented arrangement can thus be readily integrated into existing concepts and replace previous power amplifiers without necessitating a new design.

Moreover, an adjustable output power back-off is made available.

The degree of output power back-off can be adjusted as a function of the impedance inverter $Z_T$ and/or the same or different supply voltage of the first amplifier branch and the second amplifier branch (the latter on the assumption, for example, that the knee voltage is about 0 V). This allows the output power back-off BO to be readily adapted according to the above formula.

FIG. 2 shows the drain efficiency in percent over the output power in dBm for different values of an impedance inverter $Z_T$. It can be seen here that, as the resistance $Z_T$ of the impedance inverter increases, so does the drain efficiency, and the characteristic maximums diverge further, whereby the output power back-off BO can readily achieve higher values than the known solutions from the prior art. Adjustment via the impedance inverter $Z_T$ is thus also readily possible.

In the case of FIG. 2, an exemplary 62.5Ω yields a value of about 10 dB for $Z_T$ at a bandwidth of about 500 MHz. This also advantageously results in a favorable low impedance transformation ratio that tends toward 1 and thus enables a large bandwidth.

It can also be seen from FIG. 2 that, as the power on the input side increases, the second amplifier branch gradually takes over. The first maximum of the drain efficiency is substantially determined by the first amplifier branch, whereas the second amplifier branch is substantially decisive toward the second (boundary) maximum.

FIG. 3 shows the drain efficiency in percent over the output power in dBm for different ratios of the supply voltage to the first and second amplifier branch $V_{D,c}/V_{D,p}$. Here, for the sake of example, the output power back-off BO is achieved only with a varying supply voltage $V_{D,c}$ (the drain bias voltage) of the first amplifier branch while the supply voltage $V_{D,p}$ (of the drain bias voltage) of the second amplifier branch remains constant. Alternatively, the supply voltage $V_{D,p}$ of the second amplifier branch can of course also be varied and the supply voltage $V_{D,p}$ of the first amplifier branch can remain constant, or both voltage supplies can be regulated appropriately.

Preferably, however, the first amplifier branch is regulated, since this is especially simple to achieve.

In the case of FIG. 3, under the assumption of an impedance inverter $Z_T$ of, for example, 62.5Ω and a constant supply voltage $V_{D,p}$=30 V, it turns out for $V_{D,c}/V_{D,p}$ that, as the ratio of the supply voltage decreases, the output power back-off increases.

Against this background, an exemplary design process can be outlined as follows:

First, the first amplifier branch is set up to be broadband, so that the first amplifier branch achieves an approximately maximum efficiency $P_{c,sat}$. This $P_{c,sat}$ corresponds approximately to the desired output power back-off of the complete sequential broadband Doherty power amplifier for a defined load $Z_0$ (e.g., 50Ω). This corresponds approximately to the determination of the value $Z_c$. In FIG. 2, for example, $P_{c,sat}$ will correspond to the lower maximum.

In another step, the second amplifier branch is then set up to be broadband, so that the second amplifier branch reaches the maximum efficiency $P_{p,sat}$. This $P_{p,sat}$ corresponds to the minimum output power of the complete sequential broadband Doherty power amplifier for the β$Z_0$ system or approximately to the determination of $Z_p$. In FIG. 2, for example, $P_{p,sat}$ will correspond to the upper (boundary) maximum.

The two amplifier branches are then combined with one another using an impedance inverter $Z_T$. A λ/4 waveguide of the impedance $Z_T$ obtained according to the formulas above, for example as a strip line, can be used for this.

Insofar as necessary, another optimization can be performed on the basis of the parameters, for example the supply voltage and/or the impedance inverter $Z_T$.

This results in a configuration such as the following, which is described for the sake of example: In the first amplifier branch, an exemplary 6-W GaN HEMT amplifier is used, whereas a 10-W GaN HEMT amplifier is used in the second amplifier branch. A bias voltage $V_{G,c}$=−2.8 V is applied to the first amplifier branch with a drain voltage $V_{D,c}$=12 V. A bias voltage $V_{G,p}$=−6 V is applied to the second amplifier branch with a drain voltage $V_{D,p}$=30 V. These two amplifier branches are connected via an impedance inverter $Z_T$=62.5Ω (according to the above calculation rule) for an output power back-off of 10 dB. Under the assumption that the drain current of the two amplifier branches is approximately identical at saturation, i.e., $I_{p,sat}$=$I_{c,sat}$, α=3.5 and β=1.4 can now be determined, from which one obtains, in turn, $$Z_C = \begin{cases} 77\Omega & @ \ BO \\ 21.9\Omega & @ \ PEP \end{cases} \text{ and}$$

$$Z_P = \begin{cases} 175.5\Omega & @ \ BO \\ 70\Omega & @ \ PEP \end{cases}.$$

This is also consistent with FIG. 4, which shows the load modulation $Z_{1T}$, $Z_p$ and $Z_c$ from the perspective of the junction CN and the respective drain current of the respective amplifier branch via the output line in dBm.

This makes it possible to produce sequential broadband Doherty power amplifiers in which the ratio of peak envelope power to average power is greater than 6 dB and, particularly, to produce sequential broadband Doherty power amplifiers in which the ratio of peak envelope power to average power is adjustable from 6 dB to 12 dB.

According to the invention, broadband is to be understood as a bandwidth of 300 MHz and higher, particularly 500 MHz and higher.

With the method outlined above, a power amplifier was produced with a bandwidth of greater than 500 MHz at 10 watts and an output power back-off of 10 dB in order to verify the design concept. It was possible to demonstrate the expected Doherty behavior with an adjustable output power back-off from 8-11 dB over a frequency range of 1.8 GHz to 2.4 GHz. A drain efficiency of more than 65% was achieved over a frequency range of 300 MHz and of more than 58% over a frequency range of 500 MHz at saturation. Even with an exemplary 10 MHz wide LTE signal with a PAR of 7.5 dB at 2.1 GHz, a drain efficiency of about 53% was achieved, with the adjacent channel leakage ratio (ACLR) being −44.2/−48.7 dBc with an average output power of 32.7 dBm.

The invention claimed is:

1. A sequential broadband Doherty power amplifier with adjustable output power back-off, the sequential broadband Doherty power amplifier comprising:
   at least one input for receiving at least one broadband HF signal, wherein at least one of the at least one broadband HF signal has at least an average power level ($P_{avg}$) and a peak envelope power level (PEP), wherein the average power level ($P_{avg}$) and the peak envelope power level (PEP) define a crest factor C=PEP/$P_{avg}$,
   a first amplifier branch for amplifying one or more of the at least one input signal, with the first amplifier branch substantially providing amplification for at least the average power level ($P_{avg}$), and
   at least a second amplifier branch for amplifying one or more of the at least one input signal, with the at least one second amplifier branch substantially providing amplification for the peak envelope power level,
   wherein an output of the first amplifier branch is connected via an impedance inverter ($Z_T$) to an output of the second amplifier branch, with a junction (CN) being connected to a load ($Z_0$) in a substantially directly impedance-matched manner,
   wherein the first amplifier branch and the at least one second amplifier branch each have a supply voltage, with at least one of the supply voltages being variable as a function of the crest factor of the signal to be amplified,
   wherein a signal propagation delay through the first amplifier branch and the at least one second amplifier branch is substantially identical in the operating range, and
   wherein an output impedance detected by the first amplifier branch corresponds approximately to:

$$Z_c = \begin{cases} \dfrac{Z_T^2}{Z_0} & @ \ BO \\ \dfrac{Z_T^2}{\alpha Z_0} & @ \ PEP \end{cases},$$

where BO ref to an operating mode in output power back-off and PEP refers to an operating mode at peak envelope power (PEP), and wherein $$\alpha = 1 + \frac{I_{p|sat}}{I_{c|sat}} \cdot \frac{V_{DD,p} - V_{k,p}}{V_{DD,c} - V_{k,c}}$$

can be derived from currents $I_{p|sat}$, $I_{c|sat}$ of the respective amplifier branches in the case of saturation of the respective amplifier branch and the respective supply voltages $V_{DD,p}$, $V_{DD,c}$ of the amplifier branches and the knee voltages $V_{k,p}$, $V_{k,c}$ of the respective amplifier branches.

2. The sequential broadband Doherty power amplifier of claim 1, having exactly one input for receiving the at least one broadband HF signal or several broadband HF signals (RF) and at least one power splitter (DIV) for distributing the broadband HF signal or the several broadband HF signals to the first amplifier branch and the second amplifier branch.

3. The sequential broadband Doherty power amplifier of claim 1, wherein the impedance inverter makes a phase shift of a quarter wavelength available.

4. The sequential broadband Doherty power amplifier of claim 1, wherein the output impedance ($Z_p$) detected by the second amplifier branch corresponds approximately to the following formula relationship:

$$Z_p = \begin{cases} \infty & @ \ BO \\ \beta Z_0 & @ \ PEP \end{cases},$$

where BO refers to the operating mode in the case of output power back-off and PEP refers to the operating mode at peak envelope power (PEP), and $$\beta = \frac{\alpha}{\alpha - 1} \text{ with } \alpha = 1 + \frac{I_{p|sat}}{I_{c|sat}} \cdot \frac{V_{DD,p} - V_{k,p}}{V_{DD,c} - V_{k,c}}$$

can be derived from the currents $I_{p|sat}$, $I_{c|sat}$ of the respective amplifier branches in the case of saturation of the respective amplifier branch and the respective supply voltages $V_{DD,p}$, $V_{DD,c}$ of the amplifier branches and the knee voltages $V_{k,p}$, $V_{k,c}$ of the respective amplifier branches.

5. The sequential broadband Doherty power amplifier of claim 1, wherein a the takeover point (BO) between the first amplifier branch and the second amplifier branch from the respective supply voltages $V_{DD,p}$, $V_{DD,c}$ and the respective knee voltages $V_{k,c}$, $V_{k,p}$ corresponds approximately to the following formula relationship $$BO = -20\log_{10}\left(\frac{V_{DD,c} - V_{k,c}}{V_{DD,p} - V_{k,p}} \cdot \frac{Z_0}{Z_T}\right),$$

with BO being variable.

6. The sequential broadband Doherty power amplifier of claim 1, wherein a takeover point (BO) between the first amplifier branch and the second amplifier branch through modulation of the load ($Z_0$) corresponds approximately to the following formula relationship:

$$BO = -20\log_{10}\left(\frac{V_{DD,c} - V_{k,c}}{V_{DD,p} - V_{k,p}} \cdot \frac{Z_0}{Z_T}\right),$$

with BO being variable.

7. The sequential broadband Doherty power amplifier of claim 1, wherein a ratio of peak envelope power to average power is greater than 6 dB.

8. The sequential broadband Doherty power amplifier of claim 1, wherein the ratio of peak envelope power to average power is adjustable from 6 dB to 12 dB.

9. The sequential broadband Doherty power amplifier of claim 1, wherein the available bandwidth is 500 MHz or greater.

10. The sequential broadband Doherty power amplifier of claim 1, wherein the output of the first amplifier branch is connected via at least one other impedance inverter to an output of a third amplifier branch.

11. A method of using a sequential broadband Doherty power amplifier in a mobile radio communication system, the method comprising:

receiving, by at least one input of the sequential broadband Doherty power amplifier, at least one broadband HF signal, wherein at least of the at least one broadband HF signal has at least an average power level and a peak envelope power level, wherein the average power level and a peak envelope power level define a crest factor;

amplifying, by a first amplifier branch of the sequential broadband Doherty power amplifier, one or more of the at least one input signal, with the first amplifier branch substantially providing amplification for at least the average power least; and amplifying, by at least a second amplifier branch of the sequential broadband Doherty power amplifier, one or more of the at least one input signal, with the at least one second amplifier branch substantially providing amplification for the peak envelope power level, wherein in an output of the first amplifier brand is connected via an impedance inverter to an output of the second amplifier branch, with a junction being connected to a load in a substantially directly impedance-matched manner, wherein the first amplifier branch and the at least one second amplifier branch each have a supply voltage, with at least one of the supply voltages being variable as a function of the crest factor of the signal to be amplified, wherein a signal propagation delay through the first amplifier branch and the at least one second amplifier branch is substantially identical in the operating range, and wherein an output impedance detected by the first amplifier branch corresponds approximately to:

$$Z_c = \begin{cases} \dfrac{Z_T^2}{Z_0} & @ \ BO \\ \dfrac{Z_T^2}{\alpha Z_0} & @ \ PEP \end{cases},$$

where BO refers to an operating mode in output power back-off and PEP refers to an operating mode at peak envelope power (PEP), and wherein $$\alpha = 1 + \frac{I_{p|sat}}{I_{c|sat}} \cdot \frac{V_{DD,p} - V_{k,p}}{V_{DD,c} - V_{k,c}}$$

can be derived from currents $I_{p|sat}$ and $I_{c|sat}$ of the respective amplifier branch in case of saturation of the respective amplifier branch and respective supply voltages $V_{DD,p}$ and $V_{DD,c}$ of the amplifier branches and knee voltages $V_{k,p}$ and $V_{k,c}$ of the respective amplifier branches.

12. A sequential broadband Doherty power amplifier with adjustable output power back-off, the sequential broadband Doherty power amplifier comprising:

at least one input for receiving at least one broadband HF signal, wherein at least one of the at least one broadband HF signal has at least an average power level ($P_{avg}$) and a peak envelope power level (PEP), wherein the average power level ($P_{avg}$) and the peak envelope power level (PEP) define a crest factor C=PEP/$P_{avg}$, a first amplifier branch for amplifying a first input signal ($I_1$), with the first amplifier branch substantially providing amplification for at least the average power level ($P_{avg}$), and a second amplifier branch for amplifying a second input signal ($I_2$), with the second amplifier branch substantially providing amplification for the peak envelope power level (PEP), wherein an output of the first amplifier branch is connected via an impedance inverter ($Z_T$) to an output of the second amplifier branch, with a junction (CN) being connected to a load ($Z_0$) in a substantially directly impedance-matched manner, wherein the first amplifier branch and the second amplifier branch each have a supply voltage, with at least one of the supply voltages being variable as a function of a crest factor of the signal to be amplified, wherein a signal propagation delay through the at least two amplifier branches is substantially identical in the operating range, wherein an output impedance ($Z_C$) detected by the first amplifier branch corresponds approximately to the following formula relationship:

$$Z_c = \begin{cases} \dfrac{Z_T^2}{Z_0} & @ \ BO \\ \dfrac{Z_T^2}{\alpha Z_0} & @ \ PEP \end{cases},$$

where BO refers to an operating mode in output power back-off and PEP to an operating mode at peak envelope power (PEP), and wherein $$\alpha = 1 + \frac{I_{p|sat}}{I_{c|sat}} \cdot \frac{V_{DD,p} - V_{k,p}}{V_{DD,c} - V_{k,c}}$$

can be derived from currents $I_{p|sat}$, and $I_{c|sat}$ of the respective amplifier branches in the case of saturation of the respective amplifier branch and respective supply voltages $V_{DD,p}$, and $V_{DD,c}$ of the amplifier branches and knee voltages $V_{k,p}$, and $V_{k,c}$ of the respective amplifier branches, the sequential broadband Doherty power amplifier having exactly one input for receiving a broadband HF signal or several broadband HF signals (RF) and at least one power splitter (DIV) for distributing the broadband HF signal or the several broadband HF signals to the first amplifier branch and the second amplifier branch, wherein the impedance inverter ($Z_T$) makes a phase shift of a quarter wavelength available wherein the output impedance ($Z_p$) detected by the second amplifier branch corresponds approximately to the following formula relationship:

$$Z_p = \begin{cases} \infty & @ \ BO \\ \beta Z_0 & @ \ PEP \end{cases},$$

where BO refers to the operating mode in the case of output power back-off and PEP refers to the operating mode at peak envelope power (PEP), and $$\beta = \frac{\alpha}{\alpha - 1} \text{ with } \alpha = 1 + \frac{I_{p|sat}}{I_{c|sat}} \cdot \frac{V_{DD,p} - V_{k,p}}{V_{DD,c} - V_{k,c}}$$

can be derived from currents $I_{p|sat}$, and $I_{c|sat}$ of the respective amplifier branches in the case of saturation of the respective amplifier branch and the respective supply voltages $V_{DD,p}$, and $V_{DD,c}$ of the amplifier branches and the knee voltages $V_{k,p}$, and $V_{k,c}$ of the respective amplifier branches, wherein the takeover point (BO) between the first amplifier branch and the second amplifier branch from respective supply voltages $V_{DD,p}$, and $V_{DD,c}$ and the respective knee voltages $V_{k,c}$, and $V_{k,p}$ corresponds approximately to $$BO = -20\log_{10}\left(\frac{V_{DD,c} - V_{k,c}}{V_{DD,p} - V_{k,p}} \cdot \frac{Z_0}{Z_T}\right),$$

with BO being variable, wherein a takeover point (BO) between the first amplifier branch and the second amplifier branch through modulation of the load ($Z_0$) corresponds approximately to the following formula relationship:

$$BO = -20\log_{10}\left(\frac{V_{DD,c} - V_{k,c}}{V_{DD,p} - V_{k,p}} \cdot \frac{Z_0}{Z_T}\right),$$

with BO being variable, wherein a ratio of peak envelope power to average power is greater than 6 dB and adjustable from 6 dB to 12 dB, where an available bandwidth is 500 MHz or greater, wherein the output of the first amplifier branch is connected via an impedance inverter ($Z_T$) to the output of the second amplifier branch and is connected via at least one other impedance inverter to an output of a third amplifier branch.

* * * * *